United States Patent
Wangemann et al.

(10) Patent No.: US 10,551,424 B2
(45) Date of Patent: Feb. 4, 2020

(54) PROTECTION AND FAULT DETECTION FOR HIGH VOLTAGE POWER LINES ON AIRCRAFT

(71) Applicants: AIRBUS OPERATIONS GMBH, Hamburg (DE); AIRBUS DEFENCE AND SPACE GMBH, Taufkirchen (DE)

(72) Inventors: Jörg Wangemann, Magdeburg (DE); Jens Schult, Hamburg (DE)

(73) Assignee: AIRBUS OPERATIONS GMBH, Hamburg (DE)

( * ) Notice: Subject to any disclaimer, the term of this patent is extended or adjusted under 35 U.S.C. 154(b) by 122 days.

(21) Appl. No.: 15/864,304

(22) Filed: Jan. 8, 2018

(65) Prior Publication Data
US 2018/0231595 A1    Aug. 16, 2018

(30) Foreign Application Priority Data
Feb. 10, 2017 (EP) .................... 17155519

(51) Int. Cl.
*G01R 31/14* (2006.01)
*G01R 31/00* (2006.01)
(Continued)

(52) U.S. Cl.
CPC ......... *G01R 31/008* (2013.01); *G01R 31/025* (2013.01); *G08B 21/185* (2013.01);
(Continued)

(58) Field of Classification Search
CPC .. G01R 31/008; G01R 31/083; G01R 31/085; G01R 31/086; G01R 31/02;
(Continued)

(56) References Cited

U.S. PATENT DOCUMENTS

| | | | | |
|---|---|---|---|---|
| 5,015,959 A | * | 5/1991 | Matthews | G01R 31/021 324/514 |
| 5,185,687 A | * | 2/1993 | Beihoff | H02H 1/0015 324/522 |

(Continued)

FOREIGN PATENT DOCUMENTS

| | | |
|---|---|---|
| DE | 102011105880 A1 | 12/2012 |
| EP | 0506319 A2 | 9/1992 |

(Continued)

OTHER PUBLICATIONS

European Patent Office, Office Action for European Patent Application No. 17155519.6 dated Aug. 16, 2017.

*Primary Examiner* — Thang X Le
(74) *Attorney, Agent, or Firm* — Lorenz & Kopf LLP

(57) ABSTRACT

A high voltage conductor for transmitting high voltage is provided. The high voltage conductor includes a power wire, a fault detection unit, and a monitoring unit. The power wire is configured for transmission of electrical energy. The fault detection unit is configured for detecting an electromagnetic field emanated by the power wire, and the monitoring unit is configured for detection of degradation in an isolation of the high voltage conductor. The monitoring unit is connected to the fault detection unit and is configured to receive an electrical signal induced in the fault detection unit, which electrical signal is induced as a result of a degradation of the isolation of the high voltage conductor. Thus, degradation of the isolation of the high voltage conductor may be recognized at an early stage.

13 Claims, 3 Drawing Sheets

(51) Int. Cl.
  *G01R 31/02* (2006.01)
  *G08B 21/18* (2006.01)
  *H05K 9/00* (2006.01)
  *G01R 29/08* (2006.01)
  *H01B 9/00* (2006.01)

(52) U.S. Cl.
  CPC ....... *H05K 9/0098* (2013.01); *G01R 29/0814* (2013.01); *H01B 9/00* (2013.01)

(58) Field of Classification Search
  CPC .............. G01R 31/025; G01R 31/1272; G01R 31/0814; G01R 15/246; H02H 1/0015; H02H 1/0023; H02H 5/10; H02H 5/26; G08B 21/185
  See application file for complete search history.

(56) References Cited

U.S. PATENT DOCUMENTS

| | | | | |
|---|---|---|---|---|
| 7,154,081 | B1* | 12/2006 | Friedersdorf | G01B 11/18 250/227.14 |
| 7,990,156 | B1* | 8/2011 | Watkins, Jr. | G01R 31/343 324/546 |
| 8,218,272 | B2* | 7/2012 | Martchevskii | H01L 39/16 361/19 |
| 9,162,770 | B2 | 10/2015 | Stuckl et al. | |
| 2004/0174308 | A1* | 9/2004 | Chang | G01R 19/155 343/703 |
| 2005/0134290 | A1* | 6/2005 | Sarkozi | G01R 31/1272 324/543 |
| 2005/0134837 | A1 | 6/2005 | Sarkozi et al. | |
| 2005/0177298 | A1* | 8/2005 | Ponziani | F02C 7/266 701/100 |
| 2007/0085548 | A1* | 4/2007 | Shinmoto | G01R 31/1272 324/508 |
| 2016/0080839 | A1* | 3/2016 | Fuchs | H01Q 1/46 340/870.01 |

FOREIGN PATENT DOCUMENTS

| | | |
|---|---|---|
| EP | 1564492 A1 | 8/2005 |
| WO | 2015144199 A1 | 10/2015 |

\* cited by examiner

PROTECTION AND FAULT DETECTION FOR HIGH VOLTAGE POWER LINES ON AIRCRAFT

CROSS-REFERENCE TO PRIORITY APPLICATION

This application claims the benefit of, and priority to, European patent application number EP 17155519.6, filed Feb. 10, 2017. The content of the referenced application is incorporated by reference herein.

TECHNICAL FIELD

The present description relates to a high voltage conductor for transmitting high voltage, a propulsion system for an aircraft with such a high voltage conductor, and to an aircraft comprising such a propulsion system.

BACKGROUND

Typically, commercial aircraft such as business jets or passenger aircraft are driven by turbines or engines which require some kind of combustible fuel. In recent times, efforts have been made to provide electrically powered engines and to use such engines in aircraft.

However, in future aircraft generations, electrical propulsion may play a major role. In order to transmit the required amount of electrical power, voltage levels far beyond today's voltage levels may be required. For this purpose, specific conductors or wires may be required.

Patent documents DE 10 2011 105 880 A1 and U.S. Pat. No. 9,162,770 B2 generally describe an electric drive device for an aircraft with a battery for storing electrical energy and an electric motor for driving a propeller.

BRIEF SUMMARY

There may be a need to provide early detection of degradation in high voltage conductors, in particular for high voltage conductors used in a propulsion system of an aircraft.

According to an aspect, a high voltage conductor for transmitting high voltage is provided. The high voltage conductor comprises at least one power wire, a fault detection unit, and a monitoring unit. The power wire is configured for energy transmission. The fault detection unit is configured for detecting an electromagnetic field emanated by the power wire. The monitoring unit is configured for detection of degradation in an isolation of the high voltage conductor. Furthermore, the monitoring unit is connected to the fault detection unit and is configured to receive an electrical signal induced in the fault detection unit, which electrical signal is induced as a result of a degradation of the isolation of the high voltage conductor.

The high voltage conductor described herein proposes a protection and fault detection system for high voltage supply lines on aircraft enabling to introduce far higher voltage levels and, therefore, enabling transmission and usage of high power levels required for electrical propulsion. For example, the voltage levels used for electrical propulsion may be 1.000 Volt or even higher, for example up to several kilovolts.

It has been recognized that electrical arcing and sparking may influence and/or may result in constraints relating to the installation of power lines for a propulsion system in aircraft. The high voltage conductor and the propulsion system described herein propose using an isolation condition monitoring system which may detect failures or degradation of the isolation of the high voltage conductor at an early stage. The degradation may be detected even if no fault current exists. Therefore, fault currents into metallic and other conductive structural elements of the aircraft may be avoided.

For example, the power wire is an electrically conducting wire comprising a conductive core surrounded by an isolating mantle. The conductive core may be a lengthy metallic element made of, for example, copper, aluminum, titan, or an alloy comprising one or more of these materials or other materials suitable for being used for transmitting electrical energy in aircraft. The isolating mantle may be made of plastics, for example, and may be arranged to electrically insulate the conductive core from its surroundings.

The fault detection unit may also be referred to as an electromagnetic antenna which is particularly embedded inside the high voltage conductor and close to the power wire, so that electromagnetic fields emanating from the power wire induce an electric signal into the fault detection unit, which electric signal can be detected by the monitoring unit and which electric signal may be indicative of a degradation of the isolation of the high voltage conductor.

It is noted that an electric signal may be induced into the fault detection unit even if the isolation of the high voltage conductor is in a proper condition. However, the monitoring unit may be configured such that it recognizes and distinguishes if the isolation of the high voltage conductor is degraded based on a characteristic of the electric signal, wherein the characteristic of the electric signal may especially comprise an amplitude or a voltage, a current, and/or a signal pattern of the electric signal.

According to an embodiment, the fault detection unit comprises an electrically conductive detector extending in a longitudinal direction of the high voltage conductor.

The electrically conductive detector may particularly be the electromagnetic antenna. In one embodiment, the electrically conductive detector is a metallic element, for example, a wire.

According to a further embodiment, the high voltage conductor comprises an electrical shielding surrounding the power wire and the fault detection unit.

The electrical shielding may be a mesh wire circumferentially surrounding the power wire and the fault detection unit. The electrical shielding is arranged to conduct a possibly occurring fault current to a predetermined connection point. For example, the electrical shielding may be connected to ground.

According to a further embodiment, the monitoring unit is connected to the electrical shielding and is configured to detect a fault current flowing through the electrical shielding as a result of a degradation of the isolation of the high voltage conductor.

In other words, the monitoring unit is configured to control or observe the electrical shielding and to identify electrical current or an electric potential being applied to the electrical shielding. In case an electrical current or an electric potential is detected at the electrical shielding, it may be concluded that the isolation of the high voltage conductor is degraded or at least partially in an improper condition which allows for a fault current to flow from the power wire to the electrical shielding.

According to a further embodiment, the monitoring unit is configured to receive and store at least one signal pattern characteristic for an electrical signal on the fault detection unit as a result of an electric discharge of the power wire, wherein the monitoring unit is further configured to compare an electrical signal received from the fault detection unit with the least one signal pattern.

For example, typical signal patterns resulting from degraded isolations may be captured and may be provided to the monitoring unit, so that similar or identical signal patterns received from the fault detection unit may be identified by comparing the received signal patterns with the known signal patterns as to identify degradation of the isolation. For the purpose of receiving and storing the known signal patterns, the monitoring unit may comprise a memory. The memory may particularly be a persistent memory.

According to a further embodiment, the monitoring unit is configured to generate an alarm signal if the received electrical signal matches at least one signal pattern of the at least one stored signal pattern.

The alarm signal may be output by the monitoring unit and may the transmitted via a signaling line to a display or to another means for displaying information to a human operator. The alarm signal may comprise information about the signal pattern received from the fault detection unit and may also comprise additional information about the degradation of the isolation, in particular, if the latter information can be derived from a known signal pattern existing in the memory of the monitoring unit.

According to a further embodiment, the monitoring unit is connected to a first end of the fault detection unit and to a second end of the fault detection unit.

In other words, the monitoring unit is connected to both ends of the fault detection unit, so that signals received at both ends can be compared to each other. This comparison of signals received at both ends of the fault detection unit may contribute to determining a position of the degraded isolation.

According to a further embodiment, the monitoring unit is configured to generate a periodically repeating signal and to supply this periodically repeating signal to the first end and to receive the periodically repeating signal at the second end and to compare the supplied periodically repeating signal with the received periodically repeating signal, and to generate an alarm signal if the received periodically repeating signal does not match the supplied periodically repeating signal.

In this embodiment, the fault detection unit is used to transmit the periodically repeating signal from one end to the other. By comparing the output signal with the input signal, the transmission characteristics of the fault detection unit may be determined and conclusions may be drawn from the transmission characteristics to the condition of the high voltage conductor. For example, a mechanical damage to the high voltage conductor may also damage the fault detection unit and may, thus, have an impact on the transmission characteristics.

It is noted that the monitoring unit may also receive and store typical transmission characteristics for several different types of mechanical damage to the high voltage conductor, so that the type of damage may be identified based on the transmission characteristics of the fault detection unit.

According to a further embodiment, the fault detection unit further comprises an optically conductive detector. The optically conductive detector is connected to the monitoring unit and is configured to receive optical signals resulting from arcing caused by a degradation of the isolation of the high voltage conductor and the optically conductive detector is further configured to transmit the received optical signals to the monitoring unit.

In other words, the monitoring unit is configured to receive electrical signal and optical signals and to analyze these signals in order to determine a condition of the fault detection unit and, hence, the condition or state of the high voltage conductor, in particular the condition or state of an isolation of the high voltage conductor.

It is noted that the optically conductive detector may also be connected to the monitoring unit at both ends of the fault detection unit, such that the information provided with reference to the electrically conductive detector apply in a similar manner to the optically conductive detector.

According to a further embodiment, the high voltage conductor further comprises an isolation material surrounding at least the power wire and the fault detection unit such that the power wire and the fault detection unit are spaced apart from each other.

The isolation material is positioned inside the electrical shielding of the high voltage conductor. The power wire and the fault detection unit, i.e., the electrically conductive detector and the optically conductive detector, are embedded within the isolation material and extend in a longitudinal direction of the high voltage conductor. The isolation material may be provided to ensure a high voltage insulation of the high voltage conductor. The isolation material may be provided in addition to an isolating layer of the power wire. However, the power wire may not comprise an isolating layer, such that the power wire is only a conductive core which is embedded within the isolation material.

According to a further embodiment, the isolation material is made of an optically translucent material.

Thus, arcing or sparking emanating from the power wire cause an optical signal which is fed into the optically conductive detector through the optically translucent isolation material. Typically, arcing and/or sparking occur in case of degraded isolation. Hence, degradation of the isolation of the high voltage conductor can be recognized at an early stage.

According to a further embodiment, the high voltage conductor further comprises an outer protective coating surrounding the power wire and the fault detection unit.

In particular, the outer protective coating encloses the electrical shielding and all other components of the high voltage conductor. In particular, the outer protective coating is adapted to protect the high voltage conductor from mechanical damage.

It is noted that degradation of the isolation of the high voltage conductor may result from an external impact (mechanical damage, for example) or from component aging. Anyway, the fault detection unit and the monitoring unit of the high voltage conductor described herein are configured to detect undesired operation and behavior of the high voltage conductor at an early stage when the degradation of the isolation begins.

According to a further aspect, a propulsion system for an aircraft is provided. The propulsion system comprises an electrically driven engine, an energy source, and a high voltage conductor as described above and hereinafter. The energy source is configured to provide electrical energy to the electrically driven engine. The high voltage conductor is connected to the energy source and to the electrically driven engine so as to provide the engine with electrical energy.

It is noted, that the energy source may comprise multiple and/or different energy providing units such as, for example, a generator or batteries. However, the propulsion system may comprise several energy sources as to meet redundancy requirements. Furthermore, the propulsion system may comprise multiple engines in order to provide a required propulsion force.

According to an embodiment, the monitoring unit is configured to generate a warning signal and/or a maintenance signal if the monitoring unit detects a degradation of the isolation of the high voltage conductor and to provide these signals to an operator.

Thus, an operator is informed that maintenance of a high voltage conductor or at least a more detailed verification of the condition of the high voltage conductor may be required.

According to a further aspect, an aircraft is provided, comprising a propulsion system as described above and hereinafter.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

Exemplary embodiments will hereinafter be described in conjunction with the following drawing figures, wherein like numerals denote like elements, and wherein.

DETAILED DESCRIPTION

Figure 1:
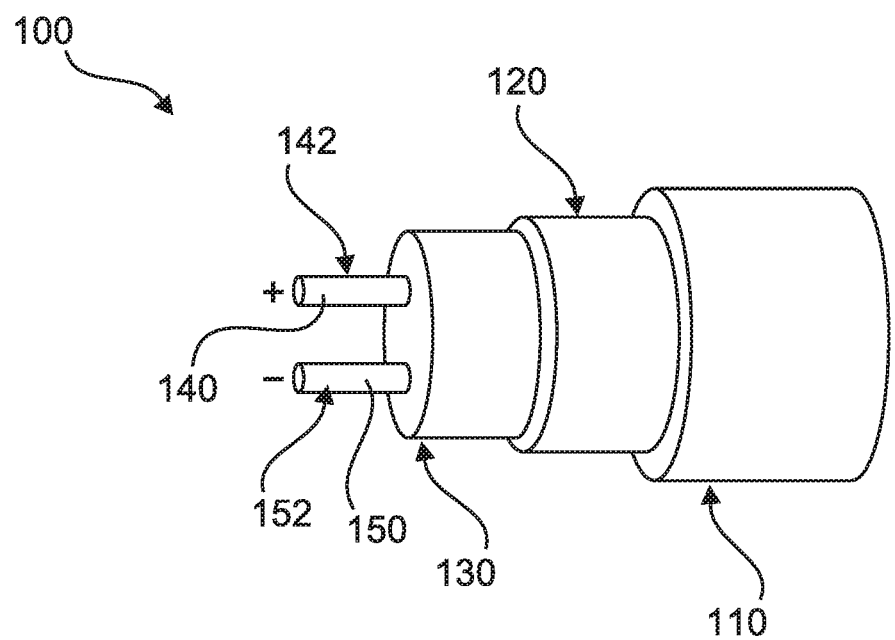
FIG. 1 illustrates a schematic view of a conventional electric conductor.

The following detailed description is merely exemplary in nature and is not intended to limit the subject of the description or the application and uses of the subject of the description. Furthermore, there is no intention to be bound by any theory presented in the preceding background or the following detailed description.

The representations and illustrations in the drawings are schematic and not to scale. Like numerals denote like elements.

A greater understanding of the high voltage conductor and the propulsion system as well as the aircraft described above may be obtained through a review of the illustrations accompanying this application together with a review of the detailed description that follows.

The subject of the description may enable the operation of very high voltage cables or conductors due to a permanent supervision and protection system. This system may allow the very early detection of degradation in the isolation barrier of the cable (high voltage conductor). Therefore, a flight can be completed and pre-emptive maintenance can be applied once a very early degradation of the isolation barrier has been detected. The subject of the description provides proper means to detect an arc fault and enables suitable actions as switching off the power system. For example, the monitoring unit may be configured to open one or more switches to disconnect the faulty high voltage conductor from energy supply.

The subject of the description relates to a high voltage conductor (also referred to as cable) surrounded by isolating material. On the outside of such a cable, a metallic overbraid or shield is applied. Inside the isolating material, there will be corona detection system embedded. Corona occurs as a function of voltage and pressure. The higher the voltage and/or the lower the atmospheric pressure (up to a maximum well above 50.000 ft FL), the higher the corona effect will be. Corona is not considered an isolation failure but may lead over extended periods to a breakdown of the isolation capability. Corona occurs first in voids or cracks of the isolator. Therefore, the existence of corona may be utilized as an early indication of a change in isolation capability or isolation degradation.

Generally, this detection may base on one or both following two principles:

a) Optical detection

Corona occurs along with optical phenomena. If the isolating material is translucent, an optical fiber can pick up any effects along the cable. If the design was such that the isolator does not show any corona effects in healthy condition, any light effect will be picked up in the cable.

b) Electromagnetic detection

Today, in test chambers the electromagnetic footprint of a corona discharge can be precisely determined. This technology is used for verification of a corona proof design on high voltage operated flight equipment. If the pick up antenna (the electrically conductive detector of the fault detection unit) would be embedded inside the conductor, a change in the electromagnetically footprint can be detected, and the existence of corona can be determined.

Additionally, the metallic overbraid (e.g., mesh wire) along the cable will allow for a constant fault current supervision between the electrical conductor (power wire) and the metallic shell. This may prevent release of electrical energy in case of a sudden breakdown of the isolation capability where the corona detection will not pick up any slow degradation (e.g. external mechanical damage).

The combination of an inflight corona detection system with a permanent isolation supervision system will allow to operate and install very high voltage power lines in the restrictions of an aircraft envelope. The detection of very early changes in the isolator enables to complete the flight safely and to perform repair and maintenance before a propulsion system was lost or before any external damage occurred.

As an option, an isolated core signal wire or optical fiber can be used to detect break of the power wire. A health signal may be continuously transmitted through the core signal wire from one to the other terminal and back. In case the power wire breaks, it is assumed that the signal wire will break as well, i.e. the health signal transmission is disturbed, which can be detected by an appropriate signal processing circuit of the monitoring unit. The signal wire (the fault detection unit) can be also used to determine the voltage drop through the power wire, for example to detect an overload condition.

FIG. 1 shows a schematic representation of a conventional electric conductor. It is noted that similar numerals are used in FIG. 1 and in the FIGS. 2 to 5 when referring to the components of the conductor.

The high voltage conductor 100 comprises a first power wire 140 and a second power wire 150. Each of the power wires comprises an electrically conductive core and optionally an isolating layer 142, 152. The power wires 140, 150 are embedded within an isolation material 130. The optional isolating layers 142, 152 and the isolation material 130 provide electrical insulation of the power wires. Furthermore, the high voltage conductor 100 comprises an electrical shielding 120 which surrounds the isolation material 130 together with the power wires 140, 150. The electrical shielding 120 may be a mesh wire extending along the entire length of the high voltage conductor 100. The electrical shielding 120 is arranged to protect the surroundings of the high voltage conductor from fault currents resulting from a degraded isolation material 130 or any other faults. For this purpose, the electrical shielding 120 may be connected to ground. Outside of the electrical shielding 120, an outer protective coating 110 is provided to protect the high voltage conductor 100 from mechanical damage.

It is noted, that the high voltage conductor 100 may comprise additional layers or that one or more of the presented layers are functionally and/or structurally separated into more than one sub-layers. For example, the electrical shielding 120 may comprise two sub-layers which are made of different materials or which are differently structured. A similar consideration does apply to the outer protective coating 110, for example.

Figure 2:
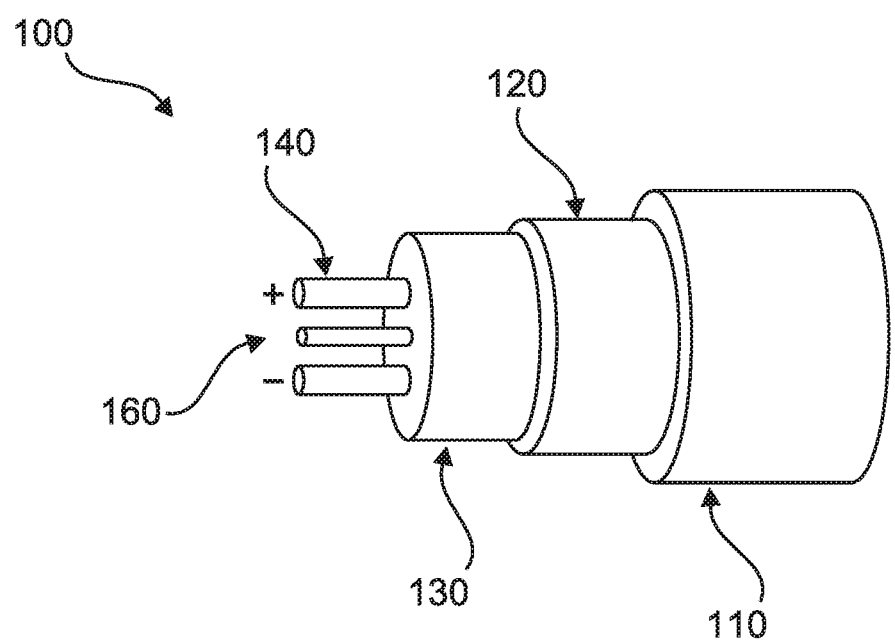
FIG. 2 illustrates a schematic view of a high voltage conductor.

FIG. 2 illustrates a high voltage conductor 100 similar to that one illustrated in FIG. 1. However, the high voltage conductor 100 illustrated in FIG. 2 further comprises a fault detection unit 160 which is also embedded into the isolation material 130 and which extends substantially parallel to the power wires 140, 150 in the longitudinal direction of the high voltage conductor 100. As can be seen in FIG. 2, the fault detection unit 160 is spaced apart from each one of the power wires.

The fault detection unit 160 may be an electrically conductive wire or any other element into which an electric current can be induced by electromagnetic fields. The power wires 140, 150 emanate electromagnetic fields if they conduct an electric current. These electromagnetic fields may vary if the isolating layers 142, 152 and/or the isolation material 130 experience degradation as a result of mechanical damage or aging. Hence, the electric current induced into the fault detection unit 160 also varies if the electromagnetic fields vary. Therefore, conclusions about degradation of the isolating components may be drawn as a result or based on the electric signal transmitted by the fault detection unit. It is noted, that the electromagnetic fields emanated by the power wires 142, 152 may vary in an alternating or irregular manner (temporal peaks of the intensity, for example) or may also be influenced such that the intensity changes permanently.

Figure 3:
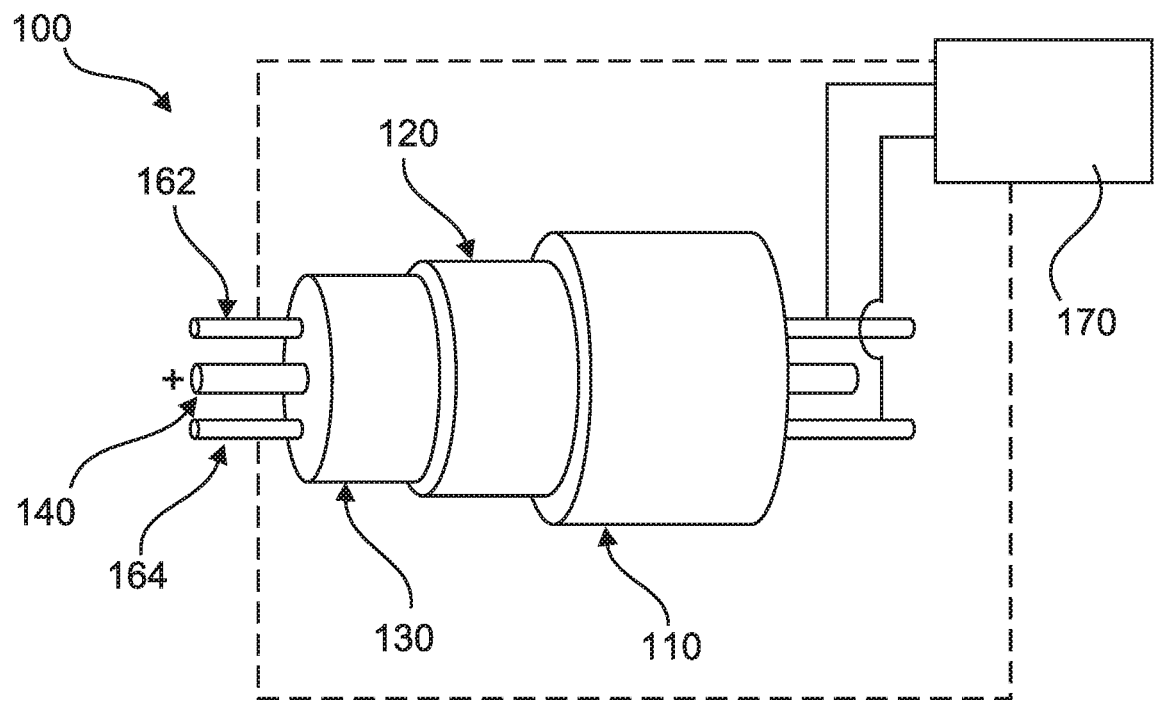
FIG. 3 illustrates a schematic view of a high voltage.

FIG. 3 illustrates the high voltage conductor 100 of FIG. 2, wherein additionally a monitoring unit 170 is schematically shown. Furthermore, the high voltage conductor 100 comprises an optically conductive detector 164 in addition to the electrically conductive detector 162. The optically conductive detector 164 extends substantially parallel to the electrically conductive detector 162 and the power wires, of which only one is shown.

The isolation material 130 is made of an optically translucent material, such that optical signals resulting from arcing and/or sparking between the power wire 140 and the electrical shielding 120 or between two power wires cause an optical signal be introduced into the optically conductive detector 164.

The monitoring unit 170 is connected to the electrically conductive detector 162 and to the optically conductive detector 164. As can be seen in FIG. 3, the monitoring unit 170 is connected to both ends of the detectors 162, 164. These connections are illustrated on the right by continuous lines and on the left by dashed lines. Thus, electrical and optical signals transmitted by the fault detection unit to both ends of the high voltage conductor can be detected by the monitoring unit 170. For detection and processing of the electrical and optical signals transmitted by the detectors 162, 164, the principles depicted above may apply. For the sake of brevity, these details are not repeated here and reference is made to the respective sections above.

It is noted that the electrically conductive detector 162 and the optically conductive detector 164 of the fault detection unit 160 may not be used for transmission of energy in the high voltage conductor, but exclusively for transmitting signals facilitated for detection of degradation of the isolation (isolation material 130 and isolating layers 142, 152) of the high voltage conductor 100.

Figure 4:
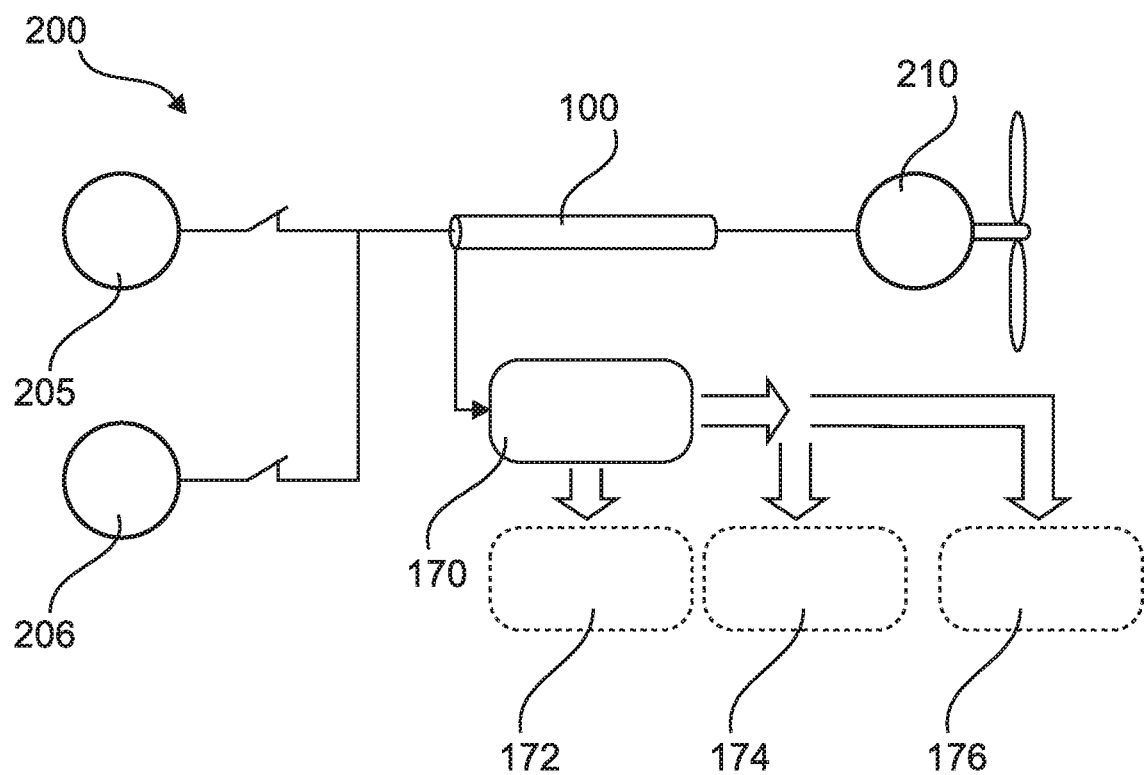
FIG. 4 illustrates a schematic view of a propulsion system.

FIG. 4 illustrates a propulsion system 200 for an aircraft, wherein the propulsion system comprises a first energy source 205 and a second energy source 206, a high voltage conductor 100 illustrated in the foregoing drawings, and an engine 210. The energy source 205 may be a generator and the energy source 206 may be a battery comprising one or more battery modules. The engine 210 is an electrically driven motor assigned and connected to a propeller for generating a propulsion force for driving an aircraft.

As can be seen in this illustration, the energy sources are connected to the engine by a high voltage conductor 100, wherein each one of the energy sources can be disconnected from the high voltage conductor by a switch. Typically, an energy source is disconnected from the high voltage conductor and, consequently, from the engine, in case only one of the energy sources is needed (for example, if the generator 205 works appropriately, the battery 206 may not be needed) or in case one of the energy sources fails. The reverse also applies: in case additional electrical power is needed, both energy sources may be connected to the high voltage conductor 100.

FIG. 4 additionally illustrates the monitoring unit 170 comprising several functional modules. The monitoring unit 170 comprises a control monitoring modules 172, a flight warning modules 174, and a maintenance modules 176. These functional modules of the monitoring unit are configured to verify and indicate the status and condition of the high voltage conductor 100, in particular of the isolation of the high voltage conductor. The functional modules may generate and output an alarm signal if the signals received from the fault detection unit 160 exceed a predetermined threshold of a signal characteristic or parameter like signal amplitude and/or signal pattern or if the signals received from the fault detection unit 160 are similar or identical to known signal patterns.

Figure 5:
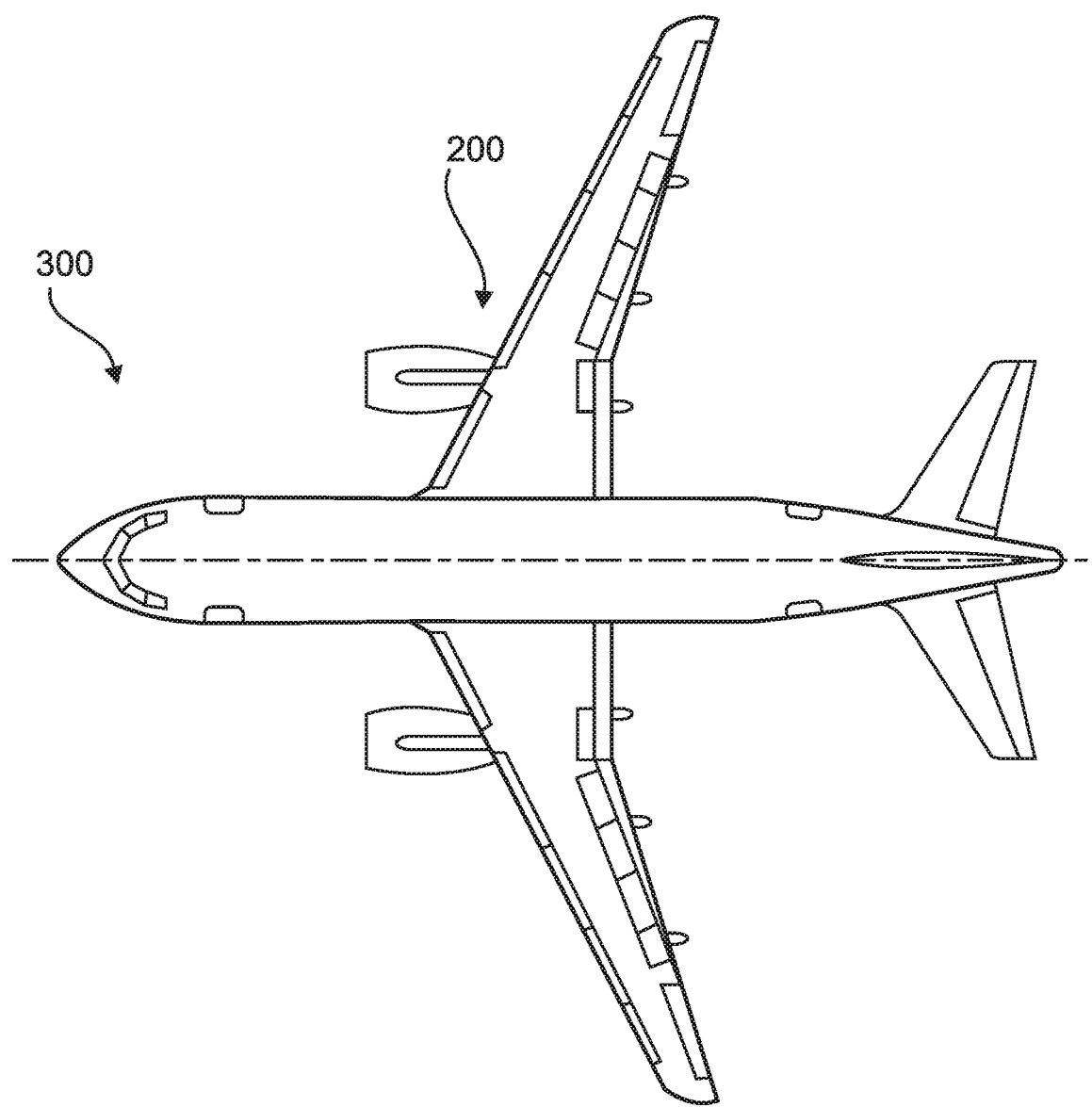
FIG. 5 illustrates a schematic view of an aircraft.

FIG. 5 illustrates an aircraft 300 comprising a propulsion system 200. The energy sources 205, 206 may be arranged within the fuselage or the wings of the aircraft and the engine as well as the propeller (not shown) may particularly be arranged at the wings of the aircraft. The high voltage conductor 100 interconnects the energy sources with the engine or engines as to provide the electric power for driving the engines. The high voltage conductor may have a length of few meters up to several tens of meters or even hundreds of meters. The monitoring unit 170 is arranged such that it can verify the condition of the high voltage conductor and that generated alarm signals are provided to an operator. For example, a warning lamp may light up as to indicate an undesired condition of the high voltage conductor. This warning lamp may be arranged in the cockpit of the aircraft or somewhere else where it is noticed by a crew member or an operator. Alternatively or additionally, the alarm signal may be transmitted to a ground control station, where initial maintenance steps of the aircraft can be initiated.

While at least one exemplary embodiment has been presented in the foregoing detailed description of the subject of the description, it should be appreciated that a vast number of variations exist. It should also be appreciated that the exemplary embodiment or exemplary embodiments are only examples, and are not intended to limit the scope, applicability, or configuration of the subject of the description in any way. Rather, the foregoing detailed description will provide those skilled in the art with a convenient road map for implementing an exemplary embodiment of the subject of the description. It being understood that various changes may be made in the function and arrangement of elements described in an exemplary embodiment without departing from the scope of the subject of the description as set forth in the appended claims.

Additionally, it is noted that "comprising" or "including" does not exclude any other elements or steps and "a" or "an" does not exclude a multitude or plurality. It is further noted that features or steps which are described with reference to one of the above exemplary embodiments may also be used in combination with other features or steps of other exemplary embodiments described above. Reference signs in the claims are not to be construed as a limitation.

LIST OF REFERENCE NUMBERS 100 high voltage conductor
110 outer protective coating
120 electrical shielding
130 isolation material
140 first power wire
142 isolating layer
150 second power wire
152 isolating layer
160 fault detection unit
162 electrically conductive detector
164 optically conductive detector
170 monitoring unit
172 control monitoring module
174 flight warning module
176 maintenance module
200 propulsion system
205 first energy source
206 second energy source
210 engine
300 aircraft

What is claimed is:

1. A high voltage conductor for transmitting high voltage, comprising:
  a power wire configured for energy transmission;
  a fault detection unit configured for detecting an electromagnetic field emanated by the power wire, the fault detection unit having a first end and a second end; and
  a monitoring unit configured for detection of degradation in an isolation of the high voltage conductor;
  wherein the monitoring unit is connected to the first and second ends of the fault detection unit and is configured to receive an electrical signal induced in the fault detection unit, which electrical signal is induced as a result of a degradation of the isolation of the high voltage conductor; and
  wherein the monitoring unit is configured to: generate a periodically repeating signal, supply the periodically repeating signal to the first end of the fault detection unit, receive the periodically repeating signal at the second end of the fault detection unit, compare the supplied periodically repeating signal with the received periodically repeating signal, and generate an alarm signal if the received periodically repeating signal does not match the supplied periodically repeating signal.

2. The high voltage conductor of claim 1, wherein the fault detection unit comprises an electrically conductive detector extending in a longitudinal direction of the high voltage conductor.

3. The high voltage conductor of claim 1, further comprising:
  an electrical shielding surrounding the power wire and the fault detection unit.

4. The high voltage conductor of claim 3, wherein the monitoring unit is connected to the electrical shielding and is configured to detect a fault current flowing through the electrical shielding as a result of a degradation of the isolation of the high voltage conductor.

5. The high voltage conductor of claim 1, wherein:
  the monitoring unit is configured to receive and store at least one signal pattern characteristic for an electrical signal on the fault detection unit as a result of an electric discharge of the power wire; and
  the monitoring unit is configured to compare an electrical signal received from the fault detection unit with the least one signal pattern.

6. The high voltage conductor of claim 5, wherein the monitoring unit is configured to generate an alarm signal if the received electrical signal matches at least one signal pattern of the at least one stored signal pattern.

7. The high voltage conductor of claim 1, wherein:
  the fault detection unit further comprises an optically conductive detector;
  the optically conductive detector is connected to the monitoring unit; and
  the optically conductive detector is configured to receive optical signals resulting from arcing caused by a degradation of the isolation of the high voltage conductor and wherein the optically conductive detector is configured to transmit the received optical signals to the monitoring unit.

8. The high voltage conductor of claim 1, further comprising:
  an isolation material surrounding at least the power wire and the fault detection unit such that the power wire and the fault detection unit are spaced apart from each other.

9. The high voltage conductor of claim 8, wherein the isolation material is made of an optically translucent material.

10. The high voltage conductor of claim 1, further comprising:
  an outer protective coating surrounding the power wire and the fault detection unit.

11. A propulsion system for an aircraft, the propulsion system comprising:
  an electrically driven engine;
  an energy source, configured to provide electrical energy to the electrically driven engine; and
  a high voltage conductor, wherein the high voltage conductor comprises:
    a power wire configured for energy transmission;
    a fault detection unit configured for detecting an electromagnetic field emanated by the power wire, the fault detection unit having a first end and a second end; and
    a monitoring unit configured for detection of degradation in an isolation of the high voltage conductor, wherein the monitoring unit is connected to the first and second ends of the fault detection unit and is configured to receive an electrical signal induced in the fault detection unit, which electrical signal is induced as a result of a degradation of the isolation of the high voltage conductor;

wherein the high voltage conductor is connected to the energy source and to the electrically driven engine so as to provide the engine with electrical energy; and wherein the monitoring unit is configured to: generate a periodically repeating signal, supply the periodically repeating signal to the first end of the fault detection unit, receive the periodically repeating signal at the second end of the fault detection unit, compare the supplied periodically repeating signal with the received periodically repeating signal, and generate an alarm signal if the received periodically repeating signal does not match the supplied periodically repeating signal.

12. The propulsion system of claim 11, wherein the monitoring unit is configured to generate a warning signal and/or a maintenance signal if the monitoring unit detects a degradation of the isolation of the high voltage conductor and to provide these signals to an operator.

13. An aircraft comprising a propulsion system, the propulsion system comprising:
   an electrically driven engine;
   an energy source configured to provide electrical energy to the electrically driven engine; and
   a high voltage conductor comprising:
      a power wire configured for energy transmission;
      a fault detection unit configured for detecting an electromagnetic field emanated by the power wire, the fault detection unit having a first end and a second end; and
      a monitoring unit configured for detection of degradation in an isolation of the high voltage conductor, wherein the monitoring unit is connected to the first and second ends of the fault detection unit and is configured to receive an electrical signal induced in the fault detection unit, which electrical signal is induced as a result of a degradation of the isolation of the high voltage conductor;
   wherein the high voltage conductor is connected to the energy source and to the electrically driven engine so as to provide the engine with electrical energy; and
   wherein the monitoring unit is configured to: generate a periodically repeating signal, supply the periodically repeating signal to the first end of the fault detection unit, receive the periodically repeating signal at the second end of the fault detection unit, compare the supplied periodically repeating signal with the received periodically repeating signal, and generate an alarm signal if the received periodically repeating signal does not match the supplied periodically repeating signal.

* * * * *